(12) United States Patent
Deng et al.

(10) Patent No.: US 9,474,165 B2
(45) Date of Patent: Oct. 18, 2016

(54) SUBSTRATE DELIVERY DEVICE AND STRONG ACID OR STRONG BASE ETCHING ADEQUATE FOR WET PROCESS

(71) Applicant: Shenzhen China Star Optoelectronics Technology Co., Ltd., Shenzhen, Guangdong (CN)

(72) Inventors: Haifeng Deng, Guangdong (CN); Jia Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/398,447

(22) PCT Filed: Aug. 15, 2014

(86) PCT No.: PCT/CN2014/084444
§ 371 (c)(1),
(2) Date: Oct. 31, 2014

(87) PCT Pub. No.: WO2016/004666
PCT Pub. Date: Jan. 14, 2016

(65) Prior Publication Data
US 2016/0009992 A1 Jan. 14, 2016

(30) Foreign Application Priority Data
Jul. 8, 2014 (CN) .......................... 2014 1 0323970

(51) Int. Cl.
*H05K 3/00* (2006.01)
*B65G 49/06* (2006.01)
(Continued)

(52) U.S. Cl.
CPC ............. *H05K 3/068* (2013.01); *B65G 49/064* (2013.01); *C03C 15/00* (2013.01); *C09K 13/08* (2013.01);
(Continued)

(58) Field of Classification Search
CPC .................... H01L 21/6734; H01L 21/67333; H01L 21/677; H01L 21/67703; H01L 21/67706; H01L 21/67724; H01L 21/67739; H01L 21/67748; H01L 21/02052–21/0254; H01L 21/6704; H01L 21/67075; H01J 37/32733–37/32743; B65G 4/063; B65G 4/064; B65G 49/063; B65G 49/064
USPC ............................................. 118/500; 63/500
See application file for complete search history.

(56) References Cited

U.S. PATENT DOCUMENTS

| 4,456,116 A | * | 6/1984 | Jarman | .................. B65G 13/00 193/35 MD |
| 6,099,645 A | * | 8/2000 | Easley | ................... C30B 31/14 118/500 |

(Continued)

FOREIGN PATENT DOCUMENTS

| CN | 1648086 A | | 8/2005 |
| CN | 1797221 | * | 7/2006 |
| CN | 101170056 A | | 4/2008 |

*Primary Examiner* — Karla Moore
*Assistant Examiner* — Charlee Bennett
(74) *Attorney, Agent, or Firm* — Andrew C. Cheng (57) ABSTRACT

The present invention provides a substrate delivery device and a strong acid or strong base etching adequate for a wet process. The substrate delivery device comprises: a plurality of first delivery rollers (2) parallel to one another in an etching chamber (1), a plurality of second delivery rollers (4) parallel to one another in a cleaning chamber (3) and a carrier (5) employed for carrying a substrate (100); the carrier (5) comprises two first side frames (51) located along a direction of delivering the substrate (100), two second side frames (53) connected to ends of the two first side frames (51), a plurality of first and second connection parts (55, 57) which are intercrossing and orthogonal in an area surrounded by the two first side frames (51) and the two second side frames (53) and a plurality of supports (59) at joins of the plurality of first and second connection parts (55, 57); the plurality of first and second connection parts (55, 57) are intercrossing and orthogonal with one another to form a plurality of hollow parts (52); the substrate (100) is located on the carrier (5).

9 Claims, 6 Drawing Sheets

(51) Int. Cl.
  H01L 21/673   (2006.01)
  C03C 15/00    (2006.01)
  C09K 13/08    (2006.01)
  H01L 31/18    (2006.01)
  H01L 51/56    (2006.01)
  H05K 3/06     (2006.01)
  H01L 21/677   (2006.01)

(52) U.S. Cl.
  CPC ..... *H01L 21/6776* (2013.01); *H01L 21/67706* (2013.01); *H01L 31/18* (2013.01); *H01L 51/56* (2013.01)

(56) References Cited

U.S. PATENT DOCUMENTS

| | | | | |
|---|---|---|---|---|
| 6,318,389 | B1* | 11/2001 | Schmidt | H01L 21/67313 118/500 |
| 2003/0056724 | A1* | 3/2003 | Wada | C23C 14/50 118/500 |
| 2003/0057183 | A1* | 3/2003 | Cho | C09K 13/08 216/23 |
| 2004/0104199 | A1* | 6/2004 | Uesugi | C23F 1/02 216/83 |
| 2006/0068084 | A1* | 3/2006 | Shinozaki | C23C 14/50 427/64 |
| 2007/0159589 | A1* | 7/2007 | Koo | B65G 49/064 349/158 |
| 2009/0291203 | A1* | 11/2009 | Hagi | C03C 17/002 427/126.3 |
| 2011/0141448 | A1* | 6/2011 | Aoki | B65G 49/064 355/72 |
| 2011/0244396 | A1* | 10/2011 | Aoki | B65G 49/064 430/319 |
| 2012/0031147 | A1* | 2/2012 | Arai | B65G 49/064 65/182.2 |
| 2012/0279443 | A1* | 11/2012 | Kornmeyer | C23C 14/50 118/500 |
| 2013/0062015 | A1* | 3/2013 | Cheng | C03C 15/00 156/345.23 |
| 2013/0068592 | A1* | 3/2013 | Lofaro | H01L 21/68785 198/617 |

* cited by examiner

SUBSTRATE DELIVERY DEVICE AND STRONG ACID OR STRONG BASE ETCHING ADEQUATE FOR WET PROCESS

FIELD OF THE INVENTION

The present invention relates to a skill field of display, and more particularly to a substrate delivery device and a strong acid or strong base etching adequate for a wet process utilizing the device.

BACKGROUND OF THE INVENTION

In a display skill field, a flat panel display possesses advantages of being ultra thin, power saved and radiation free. It has been widely utilized. A present flat panel display, such as a LCD (Liquid Crystal Display) or an OLED (Organic Light Emitting Display) has been gradually replacing the CRT displays and becomes a mainstream of the display devices.

The OLED possess many outstanding properties of self-illumination, low driving voltage, high luminescence efficiency, fast response, high clarity and contrast, near 180° view angle, wide range of working temperature, applicability of flexible display and large scale full color display. The OLED generally comprises a substrate, ITO transparent anode located on the substrate, a Hole Injection Layer (HIL) located on the ITO transparent anode, a Hole Transporting Layer (HTL) located on the Hole Injection Layer, an Emitting Material Layer (EML) located on the Hole Transporting Layer, an Electron Transport Layer (ETL) located on the Emitting Material layer, an Electron Injection Layer (EIL) located on the Electron Transport Layer and a Cathode located on the Electron Injection Layer.

The LCD in general includes a shell, a liquid crystal display panel in the shell and a backlight module located oppositely to the liquid crystal display panel and in the shell. The structure of the liquid crystal panel comprises a TFT substrate, a color filter substrate and a liquid crystal layer positioned between the two substrates. The working theory is to apply driving voltages to the two glass substrates to control the rotations of the liquid crystal molecules to refract out the light of the backlight module for generating images.

In the manufacture process of the OLED or the LCD, the glass substrate requires the processes of cleaning, film coating, photoresist coating, exposure, development, etching and etc to form a TFT substrate. The etching process can be a dry etching or a wet etching. The wet etching is to utilize the etching liquid, generally a strong acid or strong base liquid to remove the thin film without the cover of the photoresist by chemical etching and to form a desired circuit pattern on the substrate.

Figure 1:
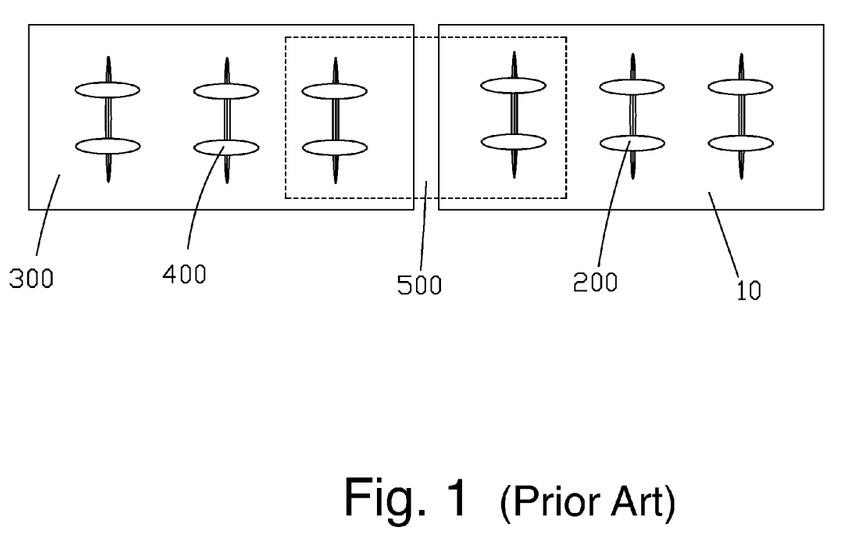
FIG. 1 is a top view diagram of a substrate delivery device according to prior art.
Figure 2:
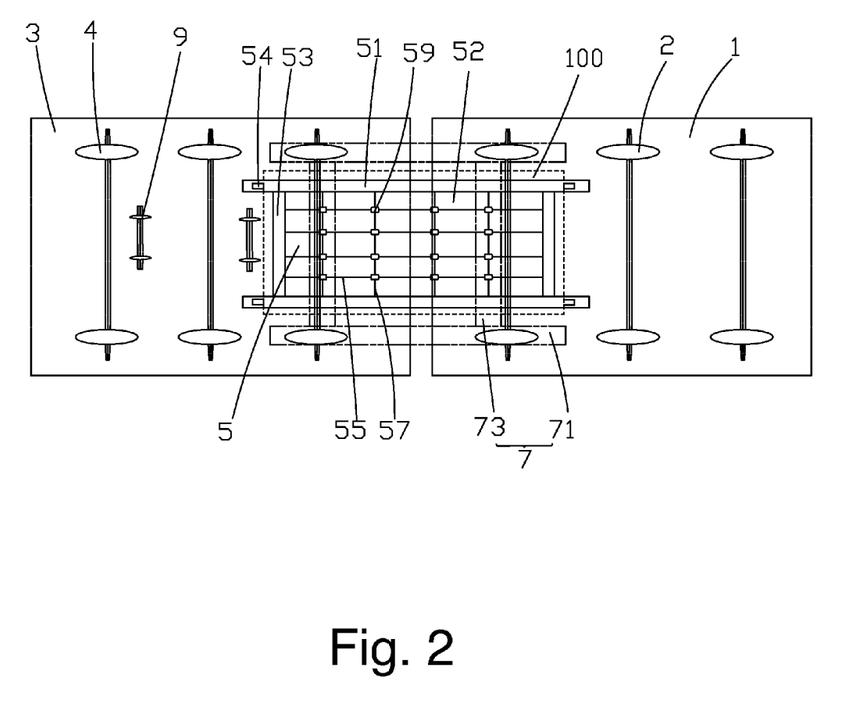
FIG. 2 is a top view diagram of a substrate delivery device according to the present invention, the dot line represents a substrate, and the full line represents a carrier, and the double dot dash line represents a support frame, and the single dot dash line represents an etching chamber, first delivery rollers, a cleaning chamber, second delivery rollers and lifting rollers.

As shown in FIG. 1, which is a top view diagram of a present substrate delivery device utilized in a Low Temperature Poly-Silicon (LTPS) TFT substrate in a wet etching process according to prior art. The present substrate delivery device comprises a plurality of first delivery rollers 200 parallel to one another in an etching chamber 10 and a plurality of second delivery rollers 400 parallel to one another in a cleaning chamber 300. The first delivery rollers 200 and the second delivery rollers 400 directly load and deliver the glass substrate 500. The back side of the glass substrate 500 directly contacts the first delivery rollers 200 in the etching chamber 10 and the second delivery rollers 400 in a cleaning chamber 300. In the etching chamber 10, the hydrofluoric acid (HF) is employed for implementing etching to the glass substrate 500, the first delivery rollers 200 can easily contact the hydrofluoric acid and to be splashed with. Then, the first delivery rollers 200 can transfer the hydrofluoric acid on the back side of the glass substrate 500. When the concentration of the hydrofluoric acid reaches up over 3%. The corrosion to the glass substrate 500 will occur to cause the issue of uneven brightness of the back side of the substrate 500. The yield of the products is affected, which leads to the descending market competitiveness of the products.

SUMMARY OF THE INVENTION

An objective of the present invention is to provide a substrate delivery device capable of preventing a back side of a substrate to contact etching liquid of strong acid or strong base in a wet etching process and eliminating the issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchange the substrate.

Another objective of the present invention is to provide a strong acid or strong base etching adequate for a wet process. The etching is capable of preventing a back side of a substrate to contact etching liquid of strong acid or strong base in a wet etching process and solving the issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchange the substrate.

For realizing the aforesaid objective, the present invention provides a substrate delivery device, comprising: a plurality of first delivery rollers parallel to one another in an etching chamber, a plurality of second delivery rollers parallel to one another in a cleaning chamber and a carrier employed for carrying a substrate; the carrier comprises two first side frames located along a direction of delivering the substrate, two second side frames connected to ends of the two first side frames, a plurality of first connection parts and a plurality of second connection parts which are intercrossing and orthogonal in an area surrounded by the two first side frames and the two second side frames and a plurality of supports at joins of the plurality of first connection parts and the plurality of second connection parts; the plurality of first connection parts and the plurality of second connection parts are intercrossing and orthogonal with one another to form a plurality of hollow parts; the substrate is located on the carrier.

The heights of the two first side frames, the two second side frames and plurality of supports are the same; the substrate is located on the two first side frames, the two second side frames and plurality of supports.

The two first side frames comprise protruding columns positioned at the end edges, and the amount of the protruding columns is four, and the protruding columns are centrally symmetric relative to the carrier, and the protruding columns are employed for locating the substrate.

The heights of the two first side frames and the two second side frames are about 5~10 cm.

The two first side frames and the two second side frames are inward tilted 15~30° relative to the direction of the heights.

The carrier is made of polyfluortetraethylene (PTFE).

The substrate delivery device further comprises a support frame, and the support frame comprises a plurality of first support plates parallel with the first side frames and a plurality of second support plates perpendicularly connected to the plurality of first support plates; the support frame is located on the plurality of first delivery rollers and the plurality of second delivery rollers, and the carrier is located on the support frame; the support frame is made of polyfluortetraethylene (PTFE).

The substrate delivery device further comprises a plurality of lifting rollers parallel to one another in the cleaning chamber; a dimension of each of the lifting rollers is smaller than dimensions of the second delivery rollers; as the lifting rollers are relatively raised, the lifting rollers penetrate the hollow parts of the carrier to lift and deliver the substrate.

The cross sectional shapes of the plurality of supports are rectangular.

The present invention further provides a strong acid or strong base etching adequate for a wet process, comprising steps of:

Step 1, locating a substrate on a carrier;

Step 2, locating the carrier loading the substrate on a support frame;

Step 3, locating the support frame loading the carrier and the substrate on first delivery rollers, and the first delivery rollers deliver the support frame to an etching chamber;

Step 4, employing etching liquid of strong acid or strong base to implement wet etching to the substrate;

Step 5, delivering the support frame to a cleaning chamber with the first delivery rollers and second delivery rollers;

Step 6, cleaning a front side and a back side of the substrate;

Step 7, descending the second delivery rollers and relatively raising lifting rollers, and the lifting rollers penetrate hollow parts of the carrier to lift and deliver the substrate, and the substrate is delivered to a chamber of a following process.

The benefits of the present invention are: in the substrate delivery device of the present invention, the substrate is located on the carrier for delivery to prevent that the back side of the substrate directly contacts the first delivery rollers in the wet etching process. Accordingly, the back side of the substrate can be prevented to be contacted by the etching liquid of strong acid or strong base to eliminate issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchanging the substrate. In the strong acid or strong base etching adequate for a wet process, the substrate is located on the carrier for delivery to effectively prevent that the back side of the substrate directly contacts the first delivery rollers in the wet etching process to solve the issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchanging the substrate.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Please refer to FIG. 1. The present invention provides a substrate delivery device, comprising: a plurality of first delivery rollers 2 parallel to one another in an etching chamber 1, a plurality of second delivery rollers 4 parallel to one another in a cleaning chamber 3 and a carrier 5 employed for carrying a substrate 100.

The substrate 100 is a transparent substrate. Moreover, the substrate 100 is glass substrate to be employed for forming a TFT substrate of an OLED or a LCD.

Figure 3:
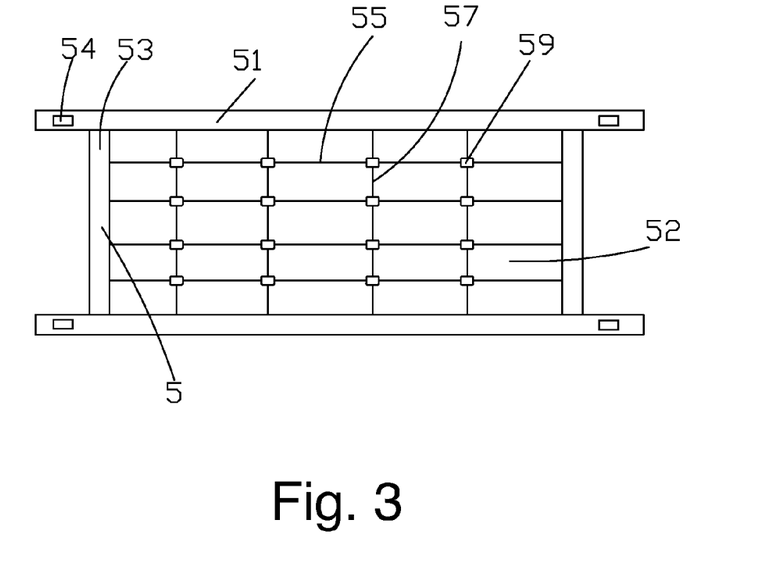
FIG. 3 is a top view diagram showing a carrier of the substrate delivery device according to the present invention.
Figure 4:
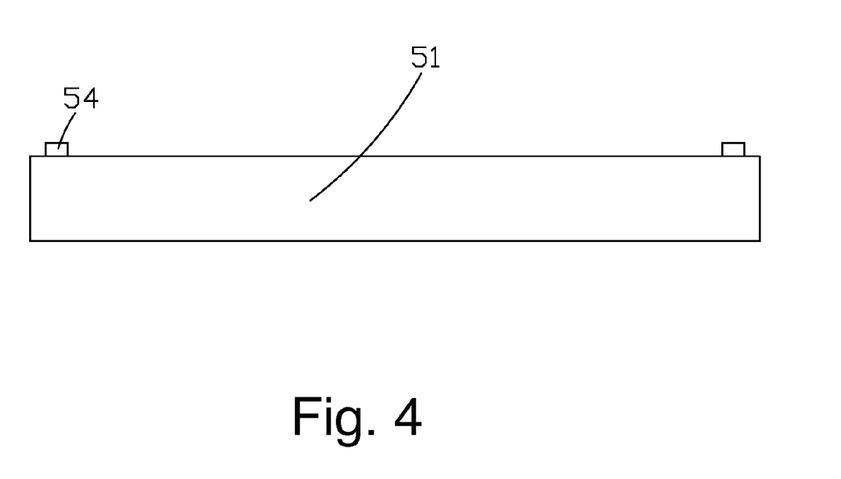
FIG. 4 is a front view diagram showing a carrier of the substrate delivery device according to the present invention.

Please refer to FIG. 3 and FIG. 4. The carrier 5 comprises two first side frames 51 located along a direction of delivering the substrate 100, two second side frames 53 connected to ends of the two first side frames 51, a plurality of first connection parts 55 and a plurality of second connection parts 57 which are intercrossing and orthogonal in an area surrounded by the two first side frames 51 and the two second side frames 53 and a plurality of supports 59 at joins of the plurality of first connection parts 55 and the plurality of second connection parts 57; A certain distance exists between every two adjacent first connection parts 55 and a certain distance exists between every two adjacent second connection parts 57, and accordingly, the plurality of first connection parts 55 and the plurality of second connection parts 57 are intercrossing and orthogonal with one another to form a plurality of hollow parts 52. The substrate 100 is located on the carrier 5. In the etching chamber 1, etching liquid of strong acid or strong base, such as HF acid, is employed to implement wet etching to the substrate 100, and the first delivery rollers 2 in the etching chamber 1 inevitably contact the etching liquid of strong acid or strong base. By locating the substrate 100 on the carrier 5, it is capable of preventing the direct contact with the etching liquid of strong acid or strong base and avoiding the corrosion to the back side of the substrate 100 by the etching liquid of strong acid or strong base to eliminate the issue of uneven brightness due to the corrosion to the back side of the substrate caused by the etching liquid. The yield of the products and the market competitiveness are raised.

Furthermore, heights of the two first side frames 51, the two second side frames 53 and plurality of supports 57 are the same. The substrate 100 is located on the two first side frames 51, the two second side frames 53 and plurality of supports 57. On one hand, the direct contact between the substrate 100 and the first delivery rollers 2 can be prevented. On the other hand, the substrate 100 can be well supported to avoid the broken substrate 100 pressed on the surface as being sprayed by the etching liquid. It is convenient to clean the back side of the substrate 100 because the carrier 5 comprises the plurality of hollow parts 52. The adhesion of the gaseous etching liquid on the back side of the substrate 100 can be prevented. Accordingly, the pollution to the chamber of the following process can be avoided.

The heights of the two first side frames 51 and the two second side frames 53 are about 5~10 cm. The two first side frames 51 and the two second side frames 53 are inward tilted 15~30° relative to the direction of the heights, which can effectively prevent the etching liquid to be splashed back onto the back side of the substrate 100 in the wet etching process.

The cross sectional shapes of the plurality of supports are regular. Preferably, the cross sectional shapes of the plurality of supports 59 are rectangular.

Figure 5:
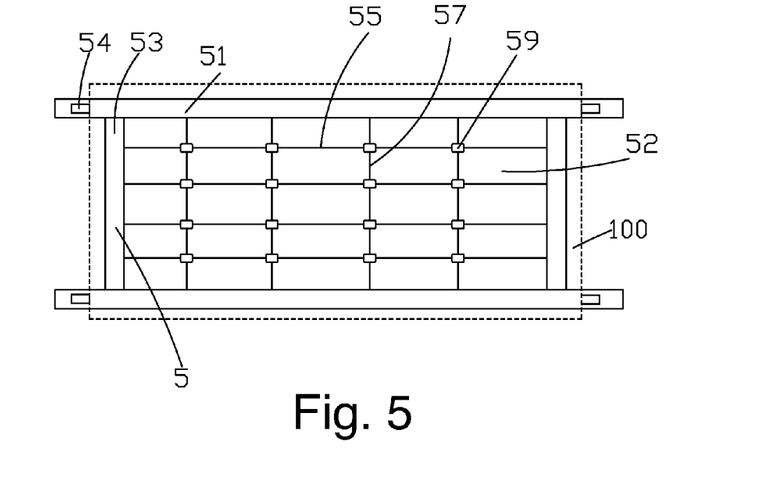
FIG. 5 is a top view diagram showing that a substrate in the substrate delivery device is located on the carrier according to the present invention.

Please refer to FIG. 5. The two first side frames 51 comprise protruding columns 54 positioned at the end edges, and the amount of the protruding columns 54 is four, and the protruding columns 54 are centrally symmetric relative to the carrier 5, and the protruding columns 54 are employed for locating the substrate 100 to prevent the slide of the substrate 100 along the direction of delivery.

The carrier 5 is made of material which is corrosion resisting to the strong acid or the strong base, such as a fluoridized and soft material. Preferably, the carrier 5 is made of polyfluortetraethylene (PTFE). When the substrate 100 is located on the carrier 5, a close contact can be formed between the substrate 100 and the carrier 5 to increase the friction force and prevent the slide of the substrate 100 in advance.

Figure 6:
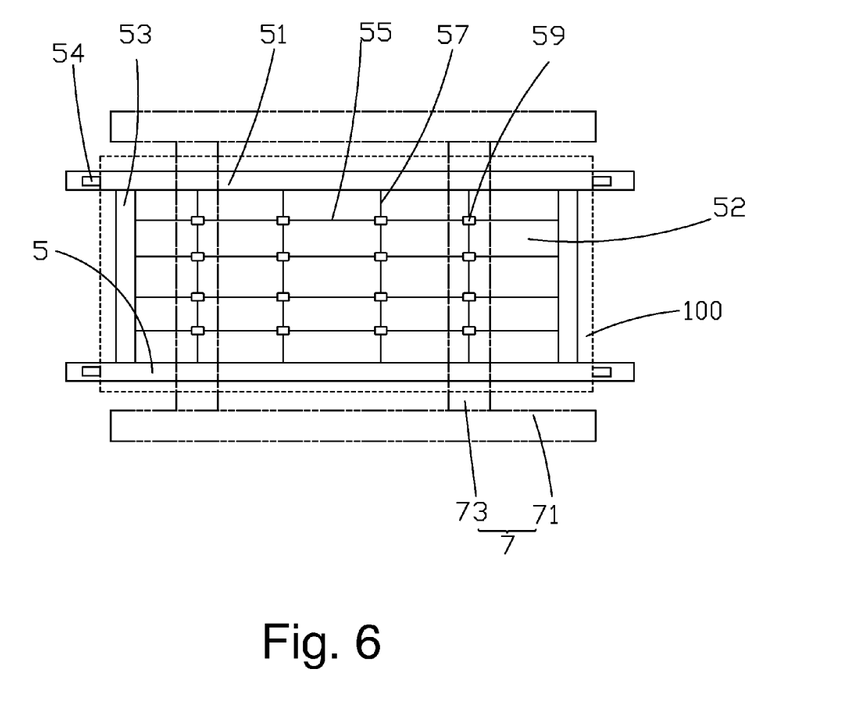
FIG. 6 is a top view diagram showing that a carrier in the substrate delivery device is located on a support frame according to the present invention.

Please refer to FIG. 1, FIG. 6. The substrate delivery device of the present invention further comprises a support frame 7. The support frame 7 comprises a plurality of first support plates 71 parallel with the first side frames 51 and a plurality of second support plates 73 perpendicularly connected to the plurality of first support plates 71. The support frame 7 is located on the plurality of first delivery rollers 2 and the plurality of second delivery rollers 4. The carrier 5 is located on the support frame 7. When the dimension of the substrate 100 is larger, the amount of the first support plates 71 can be properly increased. The supports 59 of the carrier 5 provide a firmer support to prevent the deformation of the substrate 100 as be sprayed by the etching liquid.

The support frame 7 is also made of polyfluortetraethylene (PTFE) which can resist the corrosion of the strong acid or strong base.

The substrate delivery device of the present invention further comprises a plurality of lifting rollers 9 parallel to one another in the cleaning chamber 3. A dimension of each of the lifting rollers 9 is smaller than dimensions of the second delivery rollers 4. As the second delivery rollers 4 are controlled to descend and the lifting rollers 9 are relatively raised, the lifting rollers 9 penetrate the hollow parts 52 of the carrier 5 to lift and deliver the substrate 100 to the chamber of the following process.

Figure 7:
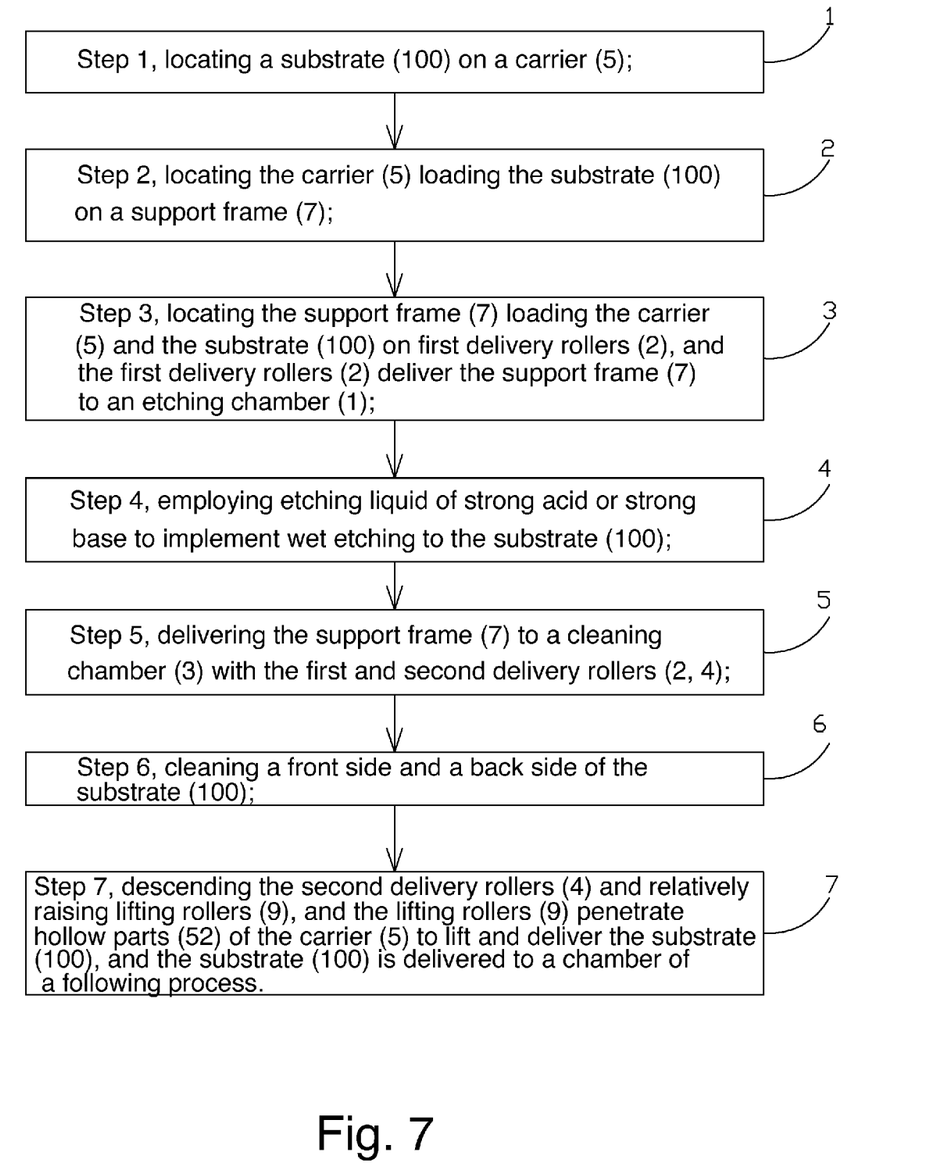
FIG. 7 is a flowchart of a strong acid or strong base etching adequate for a wet process according to the present invention.
Figure 8:
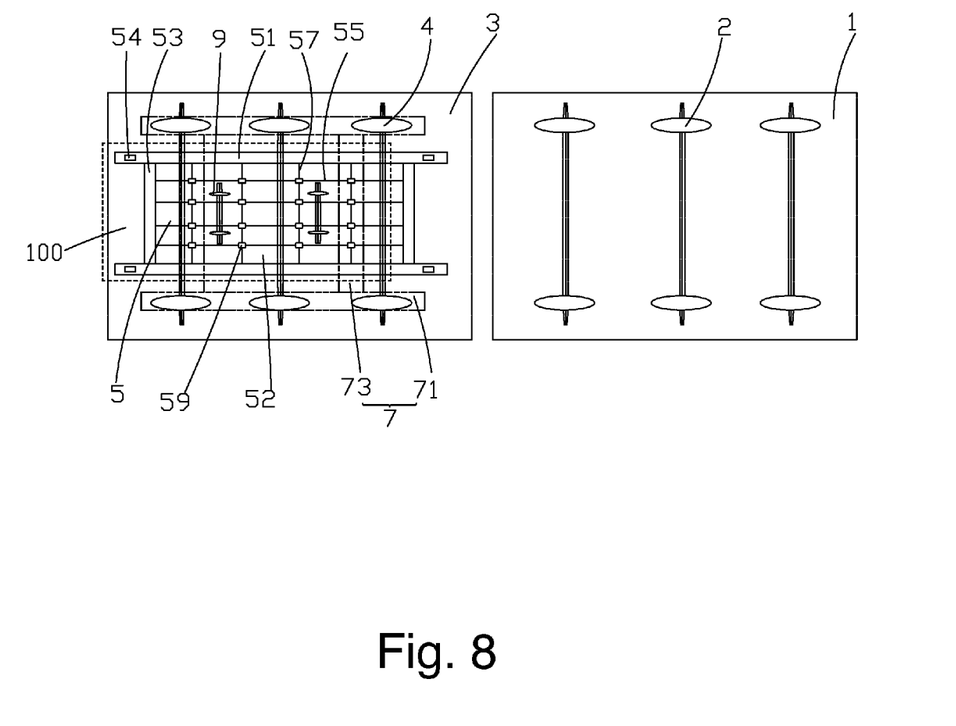
FIG. 8 is a diagram of Step 7 in a strong acid or strong base etching adequate for a wet process according to the present invention.

Please refer to FIG. 7, FIG. 8. On the basis of the substrate delivery device as aforementioned, the present invention further provides a strong acid or strong base etching adequate for a wet process, comprising steps of:

Step 1, locating the substrate 100 on the carrier 5;

Step 2, locating the carrier 5 loading the substrate 100 on the support frame 7;

Step 3, locating the support frame 7 loading the carrier 5 and the substrate 100 on the first delivery rollers 2, and the first delivery rollers 2 deliver the support frame 7 to the etching chamber 1;

Step 4, employing etching liquid of strong acid or strong base to implement wet etching to the substrate 100;

Step 5, delivering the support frame 7 to the cleaning chamber 3 with the first and second delivery rollers 2, 4;

Step 6, cleaning the front side and the back side of the substrate 100;

Step 7, descending the second delivery rollers 4 and relatively raising lifting rollers 9, and the lifting rollers 9 penetrate hollow parts 52 of the carrier 5 to lift and deliver the substrate 100, and the substrate 100 is delivered to a chamber of a following process.

In conclusion, in the substrate delivery device of the present invention, the substrate is located on the carrier for delivery to prevent that the back side of the substrate directly contacts the first delivery rollers in the wet etching process. Accordingly, the back side of the substrate can be prevented to be contacted by the etching liquid of strong acid or strong base to eliminate issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchanging the substrate. In the strong acid or strong base etching adequate for a wet process, the substrate is located on the carrier for delivery to effectively prevent that the back side of the substrate directly contacts the first delivery rollers in the wet etching process to solve the issue of uneven brightness due to the corrosion to the back side of the substrate caused by that the etching liquid directly contacts the back side of the substrate. The yield of the products and the market competitiveness are raised. It is convenient to implement cleaning the back side of the substrate and exchanging the substrate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A substrate delivery device for delivering a substrate between an etching chamber and a cleaning chamber, the substrate delivering device comprising: a plurality of first delivery rollers parallel to one another in an etching chamber, a plurality of second delivery rollers parallel to one another in a cleaning chamber and a carrier employed for carrying a substrate; the carrier comprises two first side frames located along a direction of delivering the substrate, two second side frames connected to ends of the two first side frames, a plurality of first connection parts and a plurality of second connection parts which are intercrossing and orthogonal in an area surrounded by the two first side frames and the two second side frames and a plurality of supports at joins of the plurality of first connection parts and the plurality of second connection parts; the plurality of first connection parts and the plurality of second connection parts are intercrossing and orthogonal with one another to form a plurality of hollow parts; the substrate is located on the carrier;

wherein, the substrate delivery device further comprising a support frame, and the support frame comprises a plurality of first support plates parallel with the first side frames and a plurality of second support plates perpendicularly connected to the plurality of first support plates, and the second support plates are located below the plurality of supports; the support frame is located on the plurality of first delivery rollers and the plurality of second delivery rollers, and the carrier is located on the support frame; and  wherein, a first distance formed between two of the plurality of first support plates is greater than a second distance formed between the two first side frames, and only the plurality of first support plates of the support frame are located on the plurality of first delivery rollers and the plurality of second delivery rollers; the support frame is made of polyfluortetraethylene (PTFE).

2. The substrate delivery device according to claim 1, wherein heights of the two first side frames, the two second side frames and plurality of supports are the same; the substrate is located on the two first side frames, the two second side frames and plurality of supports.

3. The substrate delivery device according to claim 2, wherein the two first side frames comprise protruding columns positioned at the end edges, and the amount of the protruding columns is four, and the protruding columns are centrally symmetric relative to the carrier, and the protruding columns are employed for locating the substrate.

4. The substrate delivery device according to claim 2, wherein the heights of the two first side frames and the two second side frames are about 5~10 cm.

5. The substrate delivery device according to claim 4, wherein the two first side frames and the two second side frames are inward tilted 15~30° relative to the direction of the heights.

6. The substrate delivery device according to claim 1, wherein the carrier is made of polyfluortetraethylene (PTFE).

7. The substrate delivery device according to claim 1, further comprising a plurality of lifting rollers parallel to one another in the cleaning chamber; a dimension of each of the lifting rollers is smaller than dimensions of the second delivery rollers; as the lifting rollers are relatively raised, the lifting rollers penetrate the hollow parts of the carrier to lift and deliver the substrate.

8. The substrate delivery device according to claim 1, wherein cross sectional shapes of the plurality of supports are rectangular.

9. A substrate delivery device for delivering a substrate between an etching chamber and a cleaning chamber, the substrate delivering device comprising: a plurality of first delivery rollers parallel to one another in an etching chamber, a plurality of second delivery rollers parallel to one another in a cleaning chamber and a carrier employed for carrying a substrate; the carrier comprises two first side frames located along a direction of delivering the substrate, two second side frames connected to ends of the two first side frames, a plurality of first connection parts and a plurality of second connection parts which are intercrossing and orthogonal in an area surrounded by the two first side frames and the two second side frames and a plurality of supports at joins of the plurality of first connection parts and the plurality of second connection parts; the plurality of first connection parts and the plurality of second connection parts are intercrossing and orthogonal with one another to form a plurality of hollow parts; the substrate is located on the carrier;

wherein heights of the two first side frames, the two second side frames and plurality of supports are the same; the substrate is located on the two first side frames, the two second side frames and plurality of supports;

wherein the two first side frames comprise protruding columns positioned at the end edges, and the amount of the protruding columns is four, and the protruding columns are centrally symmetric relative to the carrier, and the protruding columns are employed for locating the substrate;

wherein the heights of the two first side frames and the two second side frames are about 5~10 cm;

wherein the two first side frames and the two second side frames are inward tilted 15~30° relative to the direction of the heights;

wherein the carrier is made of polyfluortetraethylene (PTFE);

the substrate delivery device further comprises a support frame, and the support frame comprises a plurality of first support plates parallel with the first side frames and a plurality of second support plates perpendicularly connected to the plurality of first support plates, and the second support plates are located below the plurality of supports; the support frame is located on the plurality of first delivery rollers and the plurality of second delivery rollers, and the carrier is located on the support frame, wherein, a first distance formed between two of the plurality of first support plates is greater than a second distance formed between the two first side frames, and only the plurality of first support plates of the support frame are located on the plurality of first delivery rollers and the plurality of second delivery rollers; the support frame is made of polyfluortetraethylene (PTFE);

the substrate delivery device further comprises a plurality of lifting rollers parallel to one another in the cleaning chamber; a dimension of each of the lifting rollers is smaller than dimensions of the second delivery rollers; as the lifting rollers are relatively raised, the lifting rollers penetrate the hollow parts of the carrier to lift and deliver the substrate;

wherein cross sectional shapes of the plurality of supports are rectangular.

* * * * *